(12) United States Patent
Hayk et al.

(10) Patent No.: US 9,685,640 B2
(45) Date of Patent: Jun. 20, 2017

(54) MANUFACTURING METHOD OF DISPLAY SUBSTRATE USING A CARRIER SUBSTRATE AND A SACRIFICIAL LAYER

(71) Applicant: SAMSUNG DISPLAY CO., LTD., Yongin-si, Gyeonggi-Do (KR)

(72) Inventors: Khachatryan Hayk, Hwaseong-si (KR); Ki Hyun Kim, Daegu (KR); Jeong Ho Kim, Seoul (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/008,492

(22) Filed: Jan. 28, 2016

(65) Prior Publication Data

US 2016/0293900 A1     Oct. 6, 2016

(30) Foreign Application Priority Data

Mar. 31, 2015  (KR) ........................ 10-2015-0045316

(51) Int. Cl.
*H01L 51/56*       (2006.01)
(52) U.S. Cl.
CPC .................................. *H01L 51/56* (2013.01)
(58) Field of Classification Search
CPC .................................. H01L 51/0032–51/0095
See application file for complete search history.

(56) References Cited

U.S. PATENT DOCUMENTS

| | | | |
|---|---|---|---|
| 7,977,133 B2 | 7/2011 | Yoo | |
| 8,183,589 B2 | 5/2012 | Jeong | |
| 8,216,876 B2 | 7/2012 | Yasumatsu | |
| 2014/0145587 A1* | 5/2014 | Yoon | H01L 21/6835 313/512 |
| 2015/0140322 A1* | 5/2015 | Lin | C03C 17/009 428/334 |

FOREIGN PATENT DOCUMENTS

| | | |
|---|---|---|
| JP | 2013-075443 A | 4/2013 |
| KR | 10-2012-0055997 A | 6/2012 |

OTHER PUBLICATIONS

Inoue, et al. "Surface-Free Technology by Laser Annealing (SUFTLA) and Its Application to Poly-Si TFT-LCDs on Plastic Film With Integrated Drivers," IEEE Transactions on Electron Devices, vol. 49, No. 8, Aug. 2002, pp. 1353-1360.
Takechi, et al. "Very High Rate and Uniform Glass Etching with HF/HCl Spray for Transferring Thin-Film Transistor Arrays to Flexible Substrates," Japanese Journal of Applied Physics, vol. 45, No. 7, 2006, pp. 6008-6010.

* cited by examiner

*Primary Examiner* — Mamadou Diallo
(74) *Attorney, Agent, or Firm* — Lee & Morse, P.C.

(57) ABSTRACT

A manufacturing method of a display substrate, including preparing a carrier substrate; preparing a mixture of an organic material, an inorganic particle, and solvent; coating the mixture on the carrier substrate; forming a sacrificial layer including the inorganic particle in the organic material by curing the mixture; forming a barrier layer on the sacrificial layer; forming a display substrate on the barrier layer; and separating the barrier layer and the display substrate from the carrier substrate by applying a laser to the sacrificial layer.

17 Claims, 9 Drawing Sheets

110

MANUFACTURING METHOD OF DISPLAY SUBSTRATE USING A CARRIER SUBSTRATE AND A SACRIFICIAL LAYER

CROSS-REFERENCE TO RELATED APPLICATION

Korean Patent Application No. 10-2015-0045316, filed on Mar. 31, 2015, in the Korean Intellectual Property Office, and entitled: "Manufacturing Method of Display Substrate," is incorporated by reference herein in its entirety.

BACKGROUND

1. Field

Embodiments relate to a manufacturing method of a display substrate.

2. Description of the Related Art

Display devices may include, for example, liquid crystal displays (LCDs), plasma display panels (PDPs), organic light emitting diode (OLED) displays, field effect displays (FEDs), and electrophoretic displays. Such various display devices may be formed with a flexible material. A display device formed with a flexible material may be applied to a new item such as an electronic book or an electronic paper, and such a display device may be used in various fields.

SUMMARY

Embodiments may be realized by providing a manufacturing method of a display substrate, including preparing a carrier substrate; preparing a mixture of an organic material, an inorganic particle, and solvent; coating the mixture on the carrier substrate; forming a sacrificial layer including the inorganic particle in the organic material by curing the mixture; forming a barrier layer on the sacrificial layer; forming a display substrate on the barrier layer; and separating the barrier layer and the display substrate from the carrier substrate by applying a laser to the sacrificial layer.

The organic material may include one or more of poly-para-xylene or poly dimethyl diphenyl siloxane resin.

The inorganic particle may include one or more of molybdenum oxide ($MoO_3$), silicon (Si), Indium-Tin-Oxide (ITO), or gallium nitride (GaN).

A diameter of the inorganic particle may be about 0.1 μm to about 3 μm.

The solvent may include one or more of 1-methoxy-2-propanol or ethyl-3-ethoxupropinate.

The mixture may be coated on the carrier substrate by a spin coating method, a slit coating method, a printing method, or a chemical vapor deposition method.

The solvent may be removed by curing, the mixture with light or heat.

A thickness of the sacrificial layer may be about 40 nm to about 800 nm.

The carrier substrate may include one or more of glass, quartz, or a ceramic material.

The carrier substrate may have a thickness greater than 0 mm and equal to or less than about 3 mm.

The barrier layer may include one or more of a silicon nitride ($SiN_x$), a silicon oxide ($SiO_x$), an aluminum Oxide ($Al_2O_3$), a silicon oxynitride, an aluminum nitride, or an aluminum oxynitride.

The display substrate may be a flexible display substrate including a flexible substrate.

The flexible substrate may include one or more of polyethylene terephthalate (PET), polyethylene naphthalate (PEN), polyether ether ketone (PEEK), or polyethylene.

The laser may be an excimer laser or a solid-state laser.

The mixture coated on the carrier substrate may be a suspension.

BRIEF DESCRIPTION OF THE DRAWINGS

Features will become apparent to those of skill in the art by describing, in detail exemplary embodiments with reference to the attached drawings in which.

DETAILED DESCRIPTION

Figure 1:
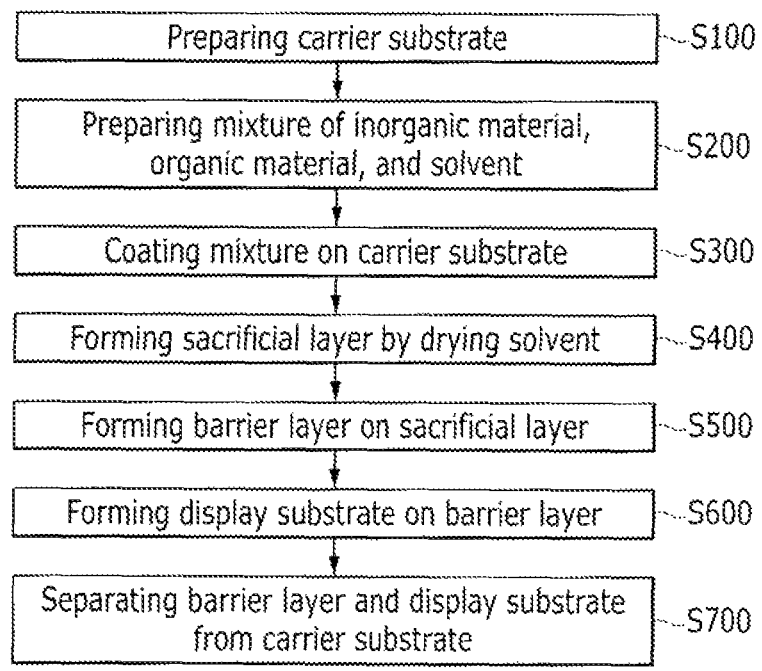
FIG. 1 illustrates a flowchart sequentially of a manufacturing method of a display substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure, will be thorough and complete, and will fully convey exemplary implementations to those skilled in the art.

In describing embodiments, a description of known functions or configurations will be omitted so as to make the subject matter of embodiments more clear.

The drawings and description are to be regarded as illustrative in nature and not restrictive. Like reference numerals designate like elements throughout the specification. In addition, the size and thickness of each component shown in the drawings arc arbitrarily shown for better understanding and ease of description, but embodiments arc not limited thereto.

In the drawings, the thickness of layers, films, panels, regions, etc., are exaggerated for clarity. In the drawings, for better understanding and ease of description, the thickness of some layers and areas is exaggerated. When a first part of a layer, a film, a plate, or the like is described as being arranged "on" or "over" a second part, this indicates that the first part may be arranged directly on or over the second part or with other parts therebetween without limiting the upper side thereof based on the direction of gravity.

FIG. 1 illustrates a flowchart sequentially of a manufacturing method of a display substrate according to an exemplary embodiment, and FIGS. 2 to 9 illustrate drawings of respective manufacturing processes of a display substrate according to an exemplary embodiment.

A manufacturing method of a display substrate according to an exemplary embodiment will now be described with reference to FIGS. 1 to 9. As shown in FIG. 1, a Manufacturing method of a display substrate according to an exemplary embodiment may include preparing a carrier substrate 110 (S100) preparing a mixture 128 (S200), coating the mixture 128 (S300), forming a sacrificial layer 120 (S400), forming a barrier layer 130 (S500), forming a display substrate 140 (S600), and separating the display substrate 140 (S700).

Figure 2:
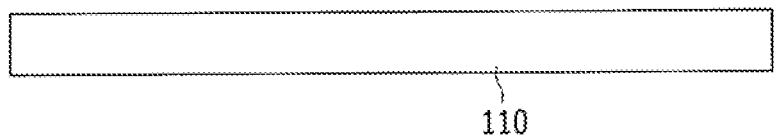
FIGS. 2 to 9 illustrate drawings of respective manufacturing processes of a display substrate according to an exemplary embodiment.

As shown in FIG. 2, the preparation operation (S100) of the carrier substrate 110 may be a process that prepares the carrier substrate 110 to secure the display substrate 140 during the manufacturing of the display substrate 140 formed with a flexible material, Unlike the display substrate 140 formed with the flexible material, the carrier substrate 110 according to the present exemplary embodiment may be formed of a rigid material, and the display substrate 140 may be attached and fixed thereto. For example, the carrier substrate 110 of the present exemplary embodiment may be formed with, e.g., include, one or more of glass, quartz, or a ceramic material.

The carrier substrate 110 according to the present exemplary embodiment may have a thickness greater than 0 mm and equal to or less than about 3 mm, which may be a much greater, e.g., larger, thickness compared to other configurations formed on the carrier substrate 110, and the display substrate 140 formed later on the carrier substrate 110 may be stabilized.

The preparation operation (S200) of the mixture 128 may be a process to prepare a material for forming the sacrificial layer 120, which may be formed between the carrier substrate 110 and the display substrate 140, and the display substrate 140 may not break when the carrier substrate 110 and the display substrate 140 are separated from the display substrate 140.

An organic material 122 used in the present exemplary embodiment may be one or more of poly-para-xylene or poly dimethyl diphenyl siloxane resin. Processes c)f manufacturing the display substrate 140 may be performed at a high temperature above about 400° C., and an organic material 122 that is stable under such high temperature may be used. As organic materials 122 used in the present exemplary embodiment, poly-para-xylene and poly dimethyl diphenyl siloxane resin are stable at high temperatures equal to or greater than about 400° C., and may be substantially applied to the sacrificial layer 120 according to the present exemplary embodiment.

An inorganic particle 124 used in the present exemplary embodiment, which may be a semiconductor material, may include one or more of molybdenum oxide ($MoO_3$), silicon (Si), Indium-Tin-Oxide (ITO), or gallium nitride (GaN).

The inorganic particle 124 may have a spherical shape according to the present exemplary embodiment, and may have a diameter of about 0.1 μm to about 3 μm.

The solvent 126 used in the present exemplary embodiment may include one or more of 1-methoxy-2-propanol or ethyl-3-ethoxypropionate . The solvent 126 may be volatile, the solvent 126 may be easily removed during the process of curing the mixture 128. Accordingly, an organic material matrix may be easily formed by the remaining organic material 122, and a process of forming the sacrificial layer 120 may be easily performed by curing the mixture 128.

The mixture 128 according to the present exemplary embodiment may be prepared in a suspension state, e.g., the mixture 128 coated on the carrier substrate 110 may be a suspension, in which the organic material 122, the inorganic particle 124, and the solvent 126 are mixed.

Operation S300 for coating the mixture 128 on the carrier substrate 110 may include dripping the mixture 128 according to the present exemplary embodiment on the carrier substrate 110, and thinly and uniformly spreading the mixture 128 on the carrier substrate 110.

Figure 3:
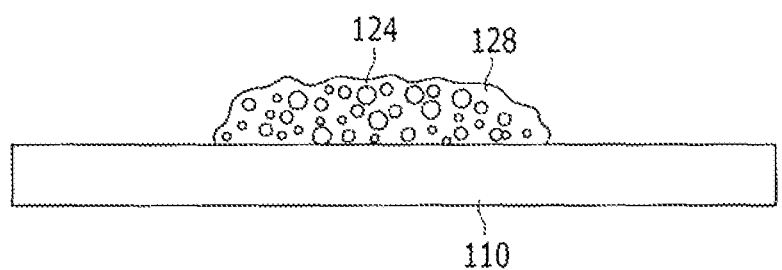
Figure 4:
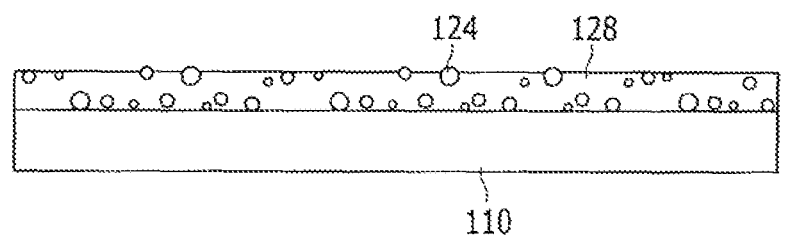

FIG. 3 illustrates that the mixture 128 according to the present exemplary embodiment drips on the carrier substrate 110, and FIG. 4 illustrate the mixture 128 thinly and uniformly coated on the carrier substrate.

As shown in FIG. 4, the mixture 128 according to the present exemplary embodiment may be thinly and uniformly coated on the carrier substrate 110 by a spin coating method, a slit coating method, a printing method, or a chemical vapor deposition method.

Figure 5:
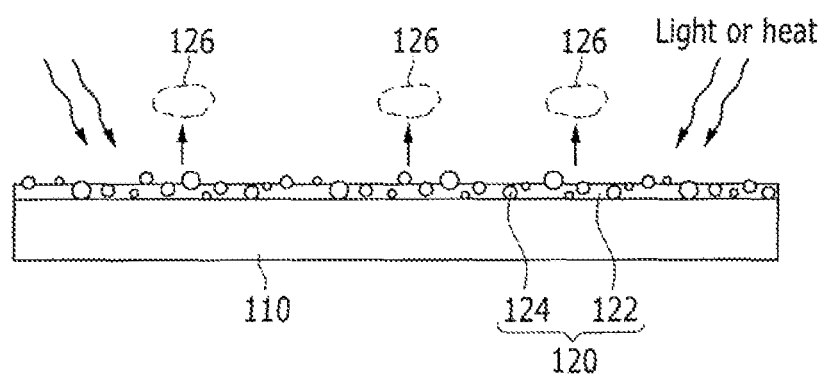

As shown in FIG. 5, the forming (S400) of the sacrificial layer 120 may be a process that forms the organic material 122 included in the mixture 128 in a matrix and forms the sacrificial layer 120 in the organic material matrix, in which the inorganic particle 124 is inserted, e.g., the inorganic particle 124 may be in the organic material 122, by thinly and uniformly spreading the coated mixture 128 on the carrier substrate 110 and then drying the solvent 126 contained in the mixture 128.

Compared with a thickness of the mixture 128 coated on the carrier substrate 110 in FIG. 4, a thickness of the sacrificial layer 120 formed by drying and removing the solvent 126 in FIG. 5 may be thinner than that of the mixture 128.

The sacrificial layer 120 formed according to the present exemplary embodiment may have a thickness of about 40 nm to about 800 nm by the organic material matrix, but since the diameter of the inorganic particle 124 inserted in the organic material matrix, e.g., since the diameter of the inorganic particle 124 in the organic material matrix, may be about 0.1 μm to about 3 μm, the inorganic particle 124 may protrude from the sacrificial layer 120, and surface roughness of the sacrificial layer 120 may increase.

When a laser 150 is applied to the sacrificial layer 120 for separating the sacrificial layer 120 after forming the display substrate 140, if the sacrificial layer 120 is smooth and transparent, since the energy absorption ratio of the sacrificial layer 120 may be low, the sacrificial layer 120 may not be easily and properly separated. Accordingly, when surfaces of the sacrificial layer 120 are formed to be rough and opaque, the energy of the laser 150 may be well absorbed in the sacrificial layer 120, and the sacrificial layer 120 may be easily and properly separated.

In the present exemplary embodiment, the sacrificial layer 120 may be formed so that the surface roughness of the sacrificial layer 120 may increase, for example, due to the inorganic particle 124 inserted in the matrix of the organic material 122, which may be suitably used at a high temperature, and transparency of the sacrificial layer 120 may decrease.

When the laser is applied to the organic material 122 or the inorganic particle 124 used in the sacrificial layer 120 of the present exemplary embodiment, gas may be generated, and the separation process may be easily performed. For example, when poly-para-xylene, the organic material 122 of the present exemplary embodiment, forms a polymer of the organic material, it may generate methane gas ($CH_4$), and when gallium nitride (GaN) the inorganic particle 124 of the present exemplary embodiment, is decomposed by the laser 150, it may generate nitrogen gas ($N_2$).

Figure 6:
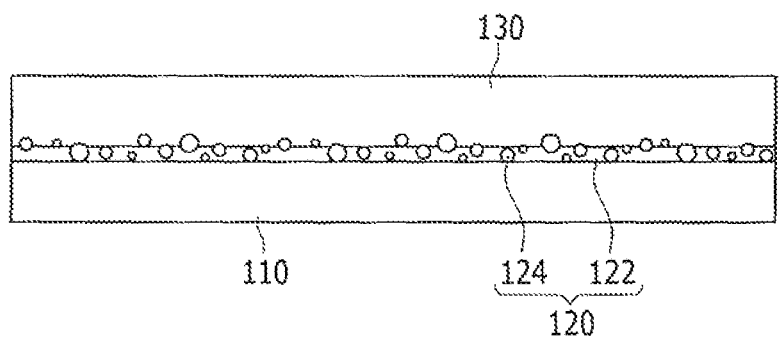

As shown in FIG. 6, the forming (S500) of the barrier layer 130 may be a process for forming the barrier layer 130 on the sacrificial layer 120 to prevent a material between the sacrificial layer 120 and the display substrate 140 from being diffused in order to protect the display substrate 140.

As a ceramic material preventing a material from being diffused, the barrier layer 130 according to the present exemplary embodiment may include, for example, one or more of a silicon nitride ($SiN_x$) a silicon oxide ($SiO_x$), an aluminum oxide ($Al_2O_3$), a silicon oxynitride, an aluminum nitride, or an aluminum oxynitride.

Figure 7:
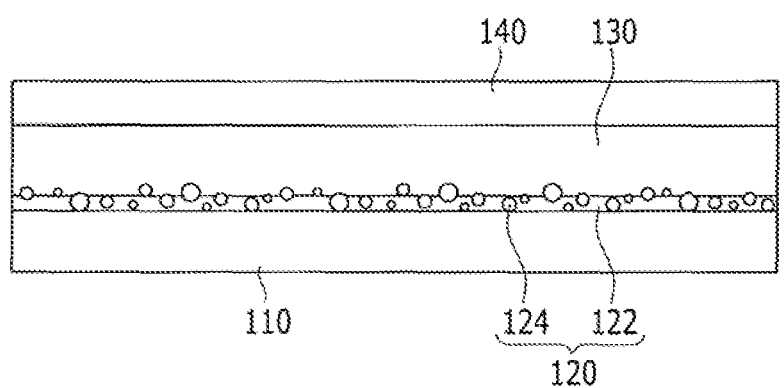

As shown in FIG. 7, the forming (S600) of the display substrate 140 may be a process for forming the display substrate 140 of the present exemplary embodiment on barrier layer 130.

A detailed structure of the display substrate 140 is not illustrated in FIG. 7, but the display substrate 140 of the present exemplary embodiment may include various display substrates, such as, for example, a liquid crystal display substrate, a plasma display substrate, an organic light emitting display substrate, according to a structure and a principle displaying an image.

The display substrate 140 according to be present exemplary embodiment may be a flexible display substrate: including a flexible substrate made with a flexible material, and the flexible substrate of the present exemplary embodiment may be a film substrate made with one or more of polyethylene terephthalate (PET), polyethylene naphthalate (PEN), polyether ether ketone (PEEK), or polyethylene. However, other display substrates made with various flexible materials that are not described herein may he applied to the present exemplary embodiment.

After completing operation S600 for forming the display substrate 140, operation S700 for separating the display substrate 140 from the carrier substrate 110 may be performed.

Operation S700 for separating the display substrate 140 from the carrier substrate 110 may be a process in which the laser 120 may be applied to the sacrificial layer 120, and the organic material 122 or the inorganic particle 124 included in the sacrificial layer 120 may react, for example, due to the laser 150, to generate gas that may separate the display substrate 140 from the carrier substrate.

Figure 8:
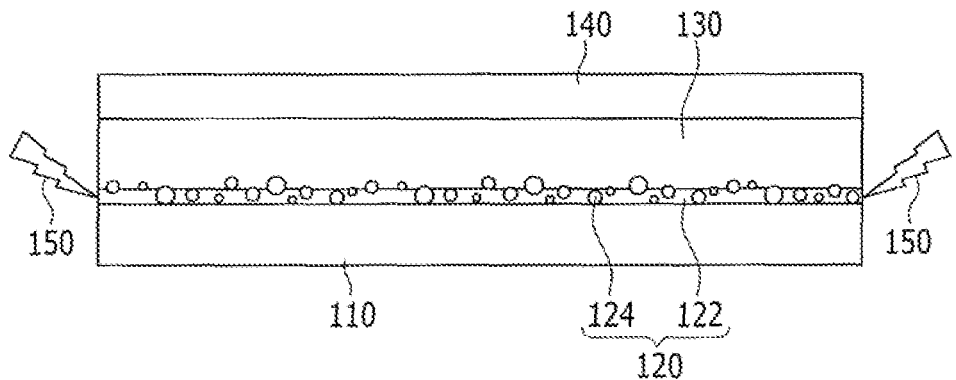
Figure 9:
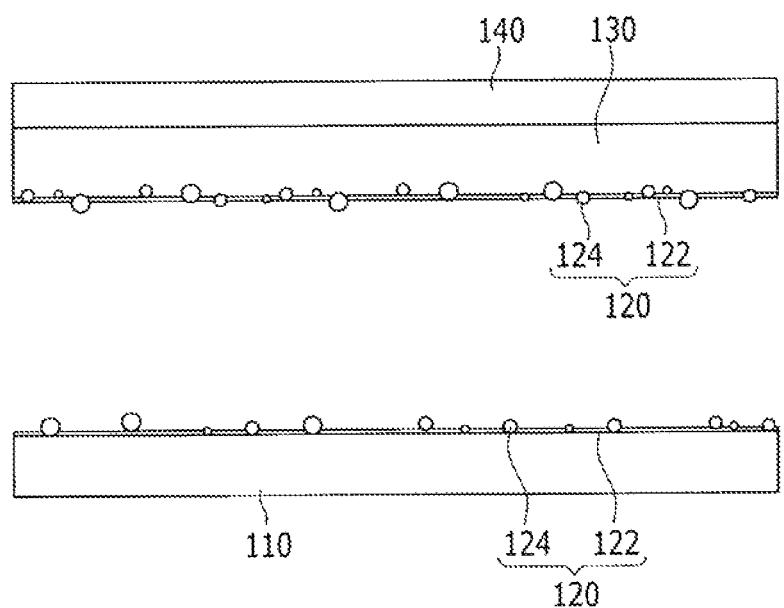

FIG. 8 illustrates a schematic view separating the display substrate 140 from the carrier substrate 110 by applying the laser 150 to the sacrificial layer 120 according to the present exemplary embodiment, and FIG. 9 illustrates a schematic view in which the display substrate 140 and the barrier layer 130 are separated from the carrier substrate 110 based on the sacrificial layer 120 according to the present exemplary embodiment.

As shown in FIG. 9, the sacrificial layer 120 of the present exemplary embodiment may remain in the display substrate 140 or the carrier substrate 110, but since the remaining sacrificial layer may be easily removed after the separation process, properties of the display substrate 140 may be not deteriorate and defects, for example, due to the remaining sacrificial layer, may be prevented.

In the present exemplary embodiment, the laser 150 that applies energy to the sacrificial layer 120 may be, for example, an excimer laser or a solid-state laser.

As described above, when the laser 150 is irradiated on the sacrificial layer 120 of the present exemplary embodiment, the organic material 122 or the inorganic material of the sacrificial layer 120 may react to generate gas by which separation of the display substrate 140 and the carrier substrate 110 may be easily performed. Since the sacrificial layer 120 of the present exemplary embodiment may be formed in a structure in which the inorganic particle 124 is inserted in the organic material matrix, e.g., since, the inorganic particle 124 may be in the organic material matrix, the surface roughness of the sacrificial layer 120 may increase and the transparency of the sacrificial layer 120 may decrease. Accordingly, the sacrificial layer 120 of the present exemplary embodiment may have improved absorption efficiency of the laser 150, and the display substrate 140 and the carrier substrate 110 may be efficiently separated.

Heretofore, the manufacturing method of the display substrate 140 in which the display substrate 140 may be easily separated from the carrier substrate 110 by using the sacrificial layer 120 including the inorganic particle 124 inserted in the organic material matrix according to the exemplary embodiment has been described. Even though the manufacturing process of the display substrate 140 may be performed at a temperature equal to or greater than about 400° C., since properties of the sacrificial layer 120 of the present exemplary embodiment may not be substantially changed and energy absorption efficiency thereof may increase, separation between the carrier substrate 110 and the display substrate 140 may be easily performed using the laser 150.

By way of summation and review, in order to form a display device structure on a flexible substrate used in a flexible display device, the flexible substrate may be fixed. The flexible substrate may be attached to a carrier substrate made of a rigid material in order to fix the flexible substrate. After manufacturing processes of the display substrate are finished, a complete display substrate may be separated from the carrier substrate. In order to prevent the substrate from being damaged in a separating process thereof, a sacrificial layer may be formed between the carrier substrate and the flexible substrate. However, a material substantially forming the sacrificial layer may be vulnerable to high temperature, and usage of the sacrificial layer may be limited.

Provided is a manufacturing method of a display substrate in which a manufacturing process thereof may be performed at a high temperature and during which separation between a carrier substrate and the display substrate may be easily performed.

According to the manufacturing method of the display substrate of embodiments, even though a manufacturing process of the display substrate may be performed at a temperature equal to or greater than about 400° C., properties of the sacrificial layer may not be substantially changed and energy absorption efficiency thereof may increase, separation between the carrier substrate and the display substrate may be easily performed using the laser.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A manufacturing method of a display substrate, comprising:
   preparing a carrier substrate;
   preparing a mixture of an organic material, inorganic particles, and a solvent;
   coating the mixture on the carrier substrate;
   forming a sacrificial layer including the inorganic particles in the organic material by curing the mixture;
   forming a barrier layer on the sacrificial layer;
   forming a display substrate on the barrier layer; and separating the barrier layer and the display substrate from the carrier substrate by applying laser energy to the sacrificial layer.

2. The manufacturing method of the display substrate as claimed in claim 1, wherein the organic material includes one or more of poly-para-xylene or poly dimethyl diphenyl siloxane resin.

3. The manufacturing method of the display substrate as claimed in claim 1, wherein the inorganic particles include one or more of molybdenum oxide ($MoO_3$), silicon (Si), indium-tin-oxide (ITO), and gallium nitride (GaN).

4. The manufacturing method of the display substrate as claimed in claim 1, wherein a diameter of the inorganic particles is about 0.1 μm to about 3 μm.

5. The manufacturing method of the display substrate as claimed in claim 1, wherein the solvent includes one or more of 1-methoxy-2-propanol or ethyl-3-ethoxypropionate.

6. The manufacturing method of the display substrate as claimed in claim 1, wherein the mixture is coated on the carrier substrate by a spin coating method, a slit coating method, a printing method, or a chemical vapor deposition method.

7. The manufacturing method of the display substrate as claimed in claim 1, wherein the solvent is removed by curing the mixture with light or heat.

8. The manufacturing method of the display substrate as claimed in claim 1, wherein a thickness of the sacrificial layer is about 40 nm to about 800 nm.

9. The manufacturing method of the display substrate as claimed in claim 1, wherein the carrier substrate includes one or more of glass, quartz, or a ceramic material.

10. The manufacturing method of the display substrate as claimed in claim 1, wherein the carrier substrate has a thickness greater than 0 mm and equal to or less than about 3 mm.

11. The manufacturing method of the display substrate as claimed in claim 1, wherein the barrier layer includes one or more of a silicon nitride ($SiN_x$), a silicon oxide ($SiO_x$), an aluminum oxide ($Al_2O_3$), a silicon oxynitride, an aluminum nitride, or an aluminum oxynitride.

12. The manufacturing method of the display substrate as claimed in claim 1, wherein the display substrate is a flexible display substrate including a flexible substrate.

13. The manufacturing method of the display substrate as claimed in claim 12, wherein the flexible substrate includes one or more of polyethylene terephthalate (PET), polyethylene naphthalate (PEN), polyether ether ketone (PEEK), or polyethylene.

14. The manufacturing method of the display substrate as claimed in claim 1, wherein the laser energy is from an excimer laser or a solid-state laser.

15. The manufacturing method of the display substrate as claimed in claim 1, wherein the mixture coated on the carrier substrate is a suspension.

16. The manufacturing method of the display substrate as claimed in claim 2, wherein forming the display substrate on the barrier layer includes processes performed at a temperature above 400° C.

17. The manufacturing method of the display substrate as claimed in claim 1, wherein,
- a diameter of the inorganic particles in the sacrificial layer is about 0.1 μm to about 3 μm,
- a thickness of the organic material in the sacrificial layer is about 40 nm to about 800 nm, and
- at least some of the inorganic particles have a diameter greater than the thickness of the organic material such that the sacrificial layer has a rough surface resulting from inorganic particles protruding from the organic material.

* * * * *